United States Patent
Lee et al.

(10) Patent No.: US 11,935,814 B2
(45) Date of Patent: Mar. 19, 2024

(54) MOTOR DRIVE DEVICE

(71) Applicants: Hyundai Motor Company, Seoul (KR); Kia Corporation, Seoul (KR)

(72) Inventors: Hyun Koo Lee, Seoul (KR); Jun Hee Park, Suwon-si (KR); Sang Cheol Shin, Suwon-si (KR); Kang Ho Jeong, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 158 days.

(21) Appl. No.: 17/407,494

(22) Filed: Aug. 20, 2021

(65) Prior Publication Data
US 2022/0199491 A1     Jun. 23, 2022

(30) Foreign Application Priority Data

Dec. 21, 2020   (KR) .......................... 10-2020-0179875

(51) Int. Cl.
*H05K 7/20* (2006.01)
*H01L 23/46* (2006.01)
*H02M 7/00* (2006.01)
*H02P 27/08* (2006.01)

(52) U.S. Cl.
CPC ............ *H01L 23/46* (2013.01); *H02M 7/003* (2013.01); *H02P 27/08* (2013.01); *H05K 7/20936* (2013.01)

(58) Field of Classification Search
None
See application file for complete search history.

(56) References Cited

U.S. PATENT DOCUMENTS

| | | | | |
|---|---|---|---|---|
| 7,289,329 B2* | 10/2007 | Chen | .................... | H01F 27/2804 336/200 |
| 7,876,561 B2* | 1/2011 | Schnetzka | .......... | H05K 7/20936 361/699 |
| 8,971,041 B2* | 3/2015 | Sharaf | ................ | H05K 7/20927 361/698 |
| 9,837,923 B2* | 12/2017 | Raju | ...................... | H02M 7/003 |
| 9,986,665 B2* | 5/2018 | Kosaka | .................. | H05K 7/209 |
| 11,350,517 B2* | 5/2022 | Yahara | ................. | H05K 7/2089 |
| 11,602,044 B2* | 3/2023 | Zhou | .................. | H05K 7/20254 |
| 2005/0162875 A1* | 7/2005 | Rodriguez | ........... | H05K 7/1432 363/68 |

FOREIGN PATENT DOCUMENTS

| KR | 10-1803733 B1 | 12/2017 |
|---|---|---|
| KR | 101885953 B1 | 8/2018 |

* cited by examiner

*Primary Examiner* — Courtney L Smith
(74) *Attorney, Agent, or Firm* — Morgan, Lewis & Bockius LLP (57) ABSTRACT

A motor drive device includes: a first inverter including a plurality of first switching elements and connected to a plurality of coils; a second inverter including a plurality of second switching elements and connected to the plurality of coils; a plurality of transfer switching elements connected to the second ends; a capacitor disposed at one side of a casing of a motor; first and second cooling channels disposed at both sides of the capacitor; a plurality of first power modules including some of the plurality of first switching elements and some of the transfer switching elements; and a plurality of second power modules including some of the plurality of second switching elements.

16 Claims, 6 Drawing Sheets

MOTOR DRIVE DEVICE

CROSS REFERENCE TO RELATED APPLICATION

The present application claims the benefit of priority to Korean Patent Application No. 10-2020-0179875 filed on Dec. 21, 2020, the entire contents of which is incorporated herein for all purposes by this reference.

TECHNICAL FIELD

The present disclosure relates to a motor drive device, and more particularly, to a motor drive device capable of operating a motor in two ways including an open-end winding manner and a closed-end winding manner by using two inverter circuits.

BACKGROUND

An inverter having a plurality of switching elements is required to operate a multiphase motor of an electric vehicle. In general, the plurality of switching elements include a pair of switching elements that correspond to a plurality of phases. For example, in the case of a three-phase motor, a total of six switching elements may be applied such that a pair of switching elements is assigned to each of the phases. The two switching elements, which correspond to each of the phases, are turned on/off complementarily when the motor operates. All the switching elements are controlled and turned on/off by pulse width modulation in order to provide the motor with power required to operate the motor.

Typically, a single inverter circuit is often used to operate the motor. However, there has been known a configuration in which two inverters are used and applied to both ends of motor coils, respectively, in order to increase an output of the motor and improve driving efficiency.

A method of using a single inverter for operating the motor is called a closed-end winding manner because ends of the motor coils form short-circuited neutral points. In contrast, a method of using the two inverters is called an open-end winding manner because the inverters are connected to both ends of the motor coils, respectively, and the ends of the motor coils are not short-circuited.

There has also been a method of operating a motor with a configuration in which inverters are applied to both ends of motor coils, like the open-end winding manner, and additional switching elements for short-circuiting/opening ends of the motor coils are provided to selectively short-circuit/open the ends of the motor coils and thus to selectively apply the closed-end winding manner or the open-end winding manner.

In this case, since there are required the plurality of switching elements including the switching elements for implementing the respective inverters and the switching elements for selecting the operating method, there is a need for implementing a motor drive device by efficiently modularizing the plurality of switching elements in consideration of cooling performance and the like.

The foregoing explained as the background is intended merely to aid in the understanding of the background of the present disclosure, and is not intended to mean that the present disclosure falls within the purview of the related art that is already known to those skilled in the art.

SUMMARY OF THE DISCLOSURE

The present disclosure has been made keeping in mind the above problems occurring in the related art, and the present disclosure is intended to provide a motor drive device, in which a plurality of switching elements required to operate a motor is appropriately modularized to improve efficiency in operating the motor when operating the motor in two ways including an open-end winding manner and a closed-end winding manner.

According to one aspect, a motor drive device includes: a first inverter including a plurality of first switching elements, the plurality of first switching elements connected to first ends of a plurality of coils corresponding to a plurality of phases in a motor; a second inverter including a plurality of second switching elements, the plurality of second switching elements connected to second ends of the plurality of coils; a plurality of transfer switching elements connected to the second ends and configured to open or block electrical connection between the second ends; a capacitor disposed at one side of a casing of the motor which is close to a rotary shaft; first and second cooling channels disposed at both sides of the capacitor and each of the first and second cooling channels having an interior into which a coolant is supplied; a plurality of first power modules each including some of the plurality of first switching elements and some of the transfer switching elements; and a plurality of second power modules each including some of the plurality of second switching elements, in which the plurality of first power modules and the plurality of second power modules are disposed to be in contact with one of the first and second cooling channels, and a number of power modules being in contact with the first cooling channel and a number of power modules being in contact with the second cooling channel are equal to each other.

In the embodiment of the present disclosure, the first cooling channel and the second cooling channel may communicate with each other, the coolant may be introduced into the first cooling channel from the outside and transmitted to the second cooling channel, and the coolant may be discharged to the outside from the second cooling channel.

In the embodiment of the present disclosure, the plurality of first power modules may be disposed to be in contact with the first cooling channel, and the plurality of second power modules may be disposed to be in contact with the second cooling channel.

In the embodiment of the present disclosure, some of the plurality of first power modules may be disposed to be in contact with the second cooling channel, the remaining first power modules may be disposed to be in contact with the first cooling channel, the number of first power modules disposed to be in contact with the first cooling channel may be larger than the number of first power modules disposed to be in contact with the second cooling channel, some of the plurality of second power modules may be disposed to be in contact with the first cooling channel, the remaining second power modules may be disposed to be in contact with the second cooling channel, and the number of second power modules disposed to be in contact with the second cooling channel may be larger than the number of second power modules disposed to be in contact with the first cooling channel.

In the embodiment of the present disclosure, each of the first power modules may include the pair of first switching elements connected to the first end of one phase coil among the coils of the motor, and one transfer switching element connected to the second end of the corresponding phase coil, and each of the second power modules may include the pair of second switching elements connected to the second end of one phase coil among the coils of the motor.

In the embodiment of the present disclosure, a switching loss of the first switching element may be smaller than a switching loss of the second switching element.

In the embodiment of the present disclosure, the first switching element may be an FET made of SiC, and the second switching element may be an IGBT made of Si.

According to another aspect, a motor drive device includes: a first inverter connected to first ends of three phase coils in a motor, the first inverter including a plurality of first switching elements; a second inverter connected to second ends of the three phase coils, the second inverter including a plurality of second switching elements; three transfer switching elements connected to the second ends and configured to open or block electrical connection between the second ends; a capacitor disposed at one side of a casing of the motor which is disposed adjacent a rotary shaft; first and second cooling channels disposed at both sides of the capacitor and each having an interior into which a coolant is supplied; three first power modules each including the pair of first switching elements connected to the first end of one of the three phase coils, and one of the transfer switching elements connected to the second ends of the corresponding three phase coils; and three second power modules each including the pair of second switching elements connected to the second end of one of the three phase coils, in which the three power modules are disposed to be in contact with each of the first and second cooling channels.

In the embodiment of the present disclosure, the first cooling channel and the second cooling channel may communicate with each other, the coolant may be introduced into the first cooling channel from the outside and transmitted to the second cooling channel, and the coolant may be discharged to the outside from the second cooling channel.

In the embodiment of the present disclosure, the three first power modules may be disposed to be in contact with the first cooling channel, and the three second power module may be disposed to be in contact with the second cooling channel.

In the embodiment of the present disclosure, the two first power modules and the one second power module may be disposed to be in contact with the first cooling channel, and the two second power modules and the one first power module may be disposed to be in contact with the second cooling channel.

In the embodiment of the present disclosure, the one second power module may be disposed between the two first power modules so as to be in contact with the first cooling channel, and the one first power module may be disposed between the two second power modules so as to be in contact with the second cooling channel.

In the embodiment of the present disclosure, a switching loss of the first switching element may be smaller than a switching loss of the second switching element. Specifically, the first switching element may be an FET made of SiC, and the second switching element may be an IGBT made of Si.

According to the motor drive device, in order to operate the motor in two ways including the open-end winding manner and the closed-end winding manner, the first power modules, which are each manufactured as one module including the transfer switching element and the pair of switching elements corresponding to each of the phases of the motor, are applied to the first inverter, and the second power modules, which are each manufactured as one module including the pair of switching elements corresponding to each of the phases of the motor, are applied to the second inverter, such that the number of all the power modules is twice the number of phases of the motor. As a result, the power modules may be symmetrically disposed so that the same number of power modules are disposed at both sides of the capacitor, thereby improving assembly properties and efficiently configuring a cooling system.

According to the motor drive device, the power modules are disposed to be in contact with the cooling channels in consideration of differences in amount of heat generated by the power modules included in the inverters when the motor operates in two ways including the open-end winding manner and the closed-end winding manner, and as a result, cooling efficiency may be further improved.

The effects obtained by the present disclosure are not limited to the aforementioned effects, and other effects, which are not mentioned above, will be clearly understood by those skilled in the art from the following description.

DETAILED DESCRIPTION OF THE DISCLOSURE

Hereinafter, motor drive devices according to various embodiments of the present disclosure will be described in detail with reference to the accompanying drawings.

Figure 1:
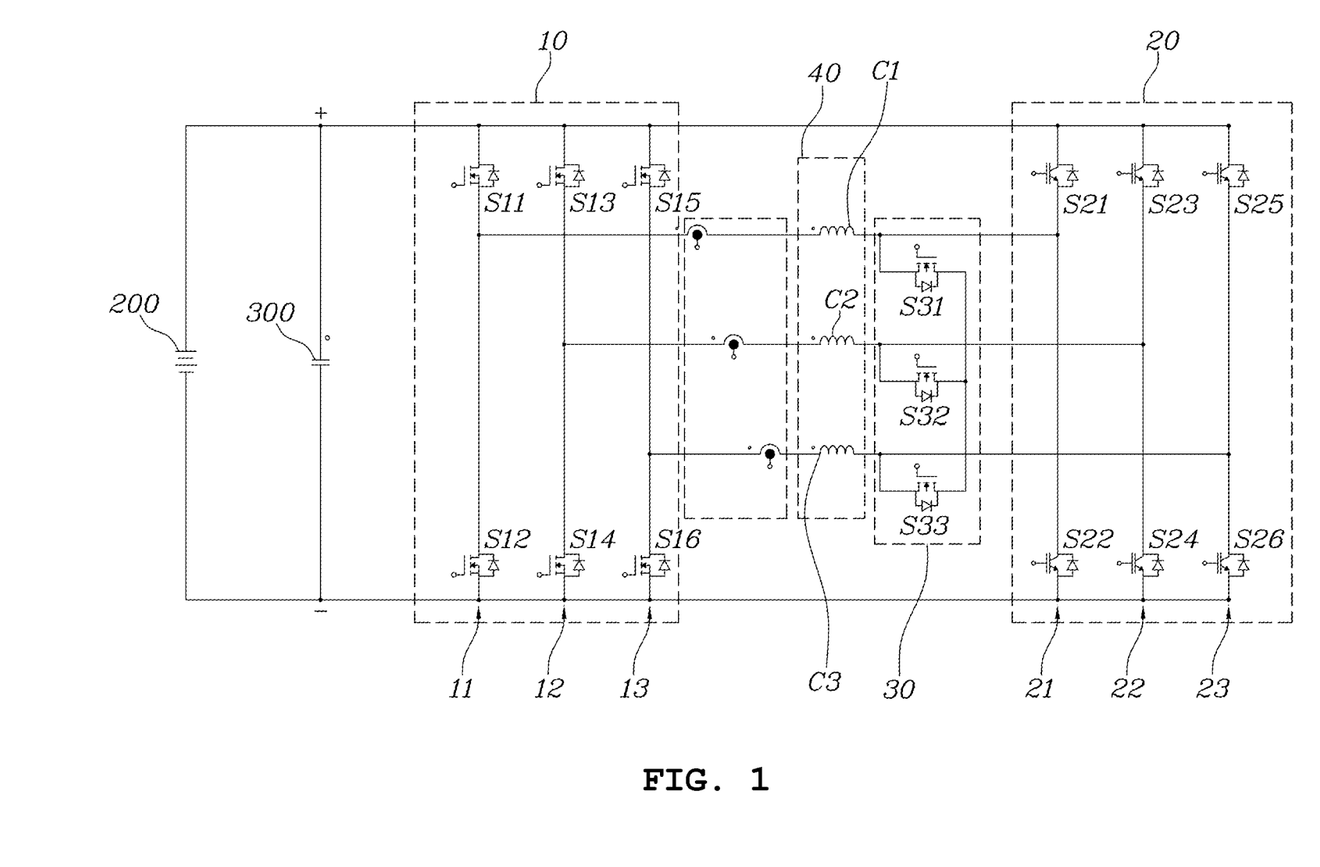
FIG. 1 is a circuit diagram of a motor drive device according to an embodiment of the present disclosure.

FIG. 1 is a circuit diagram of a motor drive device according to an embodiment of the present disclosure.

Referring to FIG. 1, the motor drive device according to the embodiment of the present disclosure includes a first inverter 10 including a plurality of first switching elements S11, S12, S13, S14, S15, and S16 and connected to first ends of coils C1, C2, and C3 of a motor 40, a second inverter 20 including a plurality of second switching elements S21, S22, S23, S24, S25, and S26 and connected to second ends of the coils C1, C2, and C3 of the motor 40, and transfer switching elements S31, S32, and S33 configured such that one end of the transfer switching element S31, one end of the transfer switching element S32, and one end of the transfer switching element S33 are connected to nodes at which the second ends of the coils C1, C2, and C3 of the motor 40 are connected to the second switching elements S21, S22, S23, S24, S25, and S26, respectively, and the other end of the transfer switching element S31, the other end of the transfer switching element S32, and the other end of the transfer switching element S33 are connected to one another.

The first inverter 10 and the second inverter 20 may convert direct current power stored in a battery 200 into three-phase alternating current power and then provide the three-phase alternating current power to the motor 40, or the first inverter 10 and the second inverter 20 may convert regenerative braking energy, which is generated by regenerative braking torque of the motor 40 during regenerative braking, into direct current and then provide the direct current to the battery 200. The conversion between the direct current power and the alternating current power may be performed by pulse width modulation control of the plurality of first switching elements S11, S12, S13, S14, S15, and S16 provided in the first inverter 10 and the plurality of second switching elements S21, S22, S23, S24, S25, and S26 provided in the second inverter 20.

The first inverter 10 may include a plurality of legs 11, 12, and 13 to which direct current voltage formed in a direct current link capacitor 300 connected between both ends of the battery 200 is applied. The legs 11, 12, and 13 correspond to the plurality of phases of the motor 40, respectively, thereby implementing electrical connection. More specifically, the first leg 11 may include the two switching elements S11 and S12 connected to each other in series between both ends of the direct current capacitor 300, and a connection node between the two switching elements S11 and S12 may be connected to one end of one phase coil C1 in the motor 40 so that the alternating current power corresponding to one of the plurality of phases is inputted or outputted. Likewise, the second leg 12 may include the two switching elements S13 and S14 connected to each other in series between both ends of the direct current capacitor 300, and a connection node between the two switching elements S13 and S14 may be connected to one end of one phase coil C2 in the motor 40 so that the alternating current power corresponding to one of the plurality of phases is inputted or outputted. Further, the third leg 13 may include the two switching elements S15 and S16 connected to each other in series between both ends of the direct current capacitor 300, and a connection node between the two switching elements S15 and S16 may be connected to one end of one phase coil C3 in the motor 40 so that the alternating current power corresponding to one of the plurality of phases is inputted or outputted.

The second inverter 20 may also have the similar configuration to the first inverter 10. The second inverter 20 may include a plurality of legs 21, 22, and 23 to which direct current voltage formed in the direct current link capacitor 300 connected between both ends of the battery 200 is applied. The legs 21, 22, and 23 correspond to the plurality of phases of the motor 40, respectively, thereby implementing electrical connection. More specifically, the first leg 21 may include the two switching elements S21 and S22 connected to each other in series between both ends of the direct current capacitor 300, and a connection node between the two switching elements S21 and S22 may be connected to the other end of one phase coil C1 in the motor 40 so that the alternating current power corresponding to one of the plurality of phases is inputted or outputted. Likewise, the second leg 22 may include the two switching elements S23 and S24 connected to each other in series between both ends of the direct current capacitor 300, and a connection node between the two switching elements S23 and S24 may be connected to the other end of one phase coil C2 in the motor 40 so that the alternating current power corresponding to one of the plurality of phases is inputted or outputted. Further, the third leg 23 may include the two switching elements S25 and S26 connected to each other in series between both ends of the direct current capacitor 300, and a connection node between the two switching elements S25 and S26 may be connected to the other end of one phase coil C3 in the motor 40 so that the alternating current power corresponding to one of the plurality of phases is inputted or outputted.

The switching element, which is connected to a high-potential side (+ terminal) of the battery 200 among the switching elements included in the respective inverters 10 and 20, is referred to as a top-phase switching element, and the switching element connected to a low-potential side (− terminal) is referred to as a bottom-phase switching element.

The first inverter 10 is connected to one end of each of the coils C1, C2, and C3 of the motor 40, and the second inverter 20 is connected to the other end of each of the coils C1, C2, and C3 of the motor 40. That is, both ends of each of the coils C1, C2, and C3 of the motor 40 may be connected to the first inverter 10 and the second inverter 20, thereby implementing open-end winding type electrical connection.

In the embodiment of the present disclosure, the transfer switching elements 30 are configured as a total of three switching elements S31, S32, and S33, and one end of the switching element S31, one end of the switching element S32, and one end of the switching element S33 are connected to the nodes at which the plurality of coils C1, C2, and C3 and the second switching elements are connected to one another. The other end of the switching element S31, the other end of the switching element S32, and the other end of the switching element S33 may be connected to one another.

In this connection structure, when the transfer switching elements 30 are turned off, both ends of the coils C1, C2, and C3 of the motor 40 are connected to the first inverter 10 and the second inverter 20, respectively, thereby operating the motor 40 with an open-end winding structure.

When the transfer switching element 30 is turned on, one end of the coil C1, one end of the coil C2, and one end of the coil C3 of the motor 40 are connected to one another, thereby forming Y-connection. In this case, the second inverter 20 is not used, but only the first inverter 10 operates to operate the motor with a closed-end winding structure.

The open-end winding structure may operate the motor with high output by using the two inverters, and the closed-end winding structure may operate the motor with high efficiency by using only the first inverter. The switching element, which is applied to the closed-end winding structure, may be a high-efficiency switching element, that is, an expensive switching element made of SiC. The second inverter, which operates with the open-end winding structure, may have the switching element made of SiC or the like, like the first inverter. However, in consideration of the fact that the second inverter selectively operates only when a high output is required, the second inverter may have an Si-based switching element, which has relatively low efficiency but may be manufactured at low cost, unlike the first inverter that operates at all times.

Various switching means, such as an MOSFET or IGBT, known in the art may be adopted as the transfer switching elements S31, S32, and S33.

Figure 2:
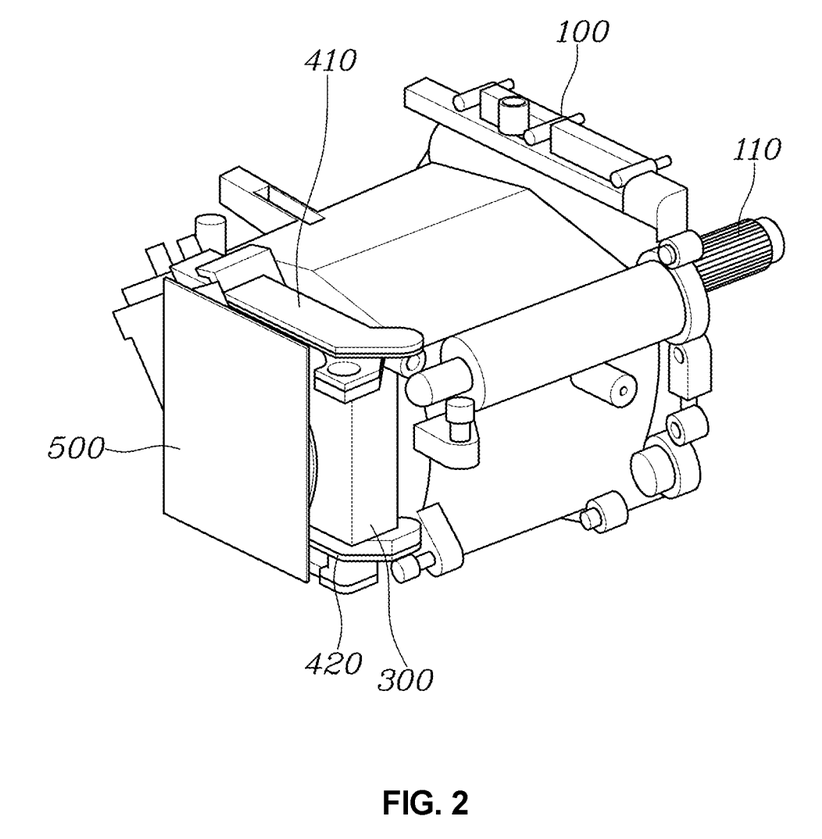
FIG. 2 is a perspective view illustrating the motor drive device according to the embodiment of the present disclosure.
Figure 3:
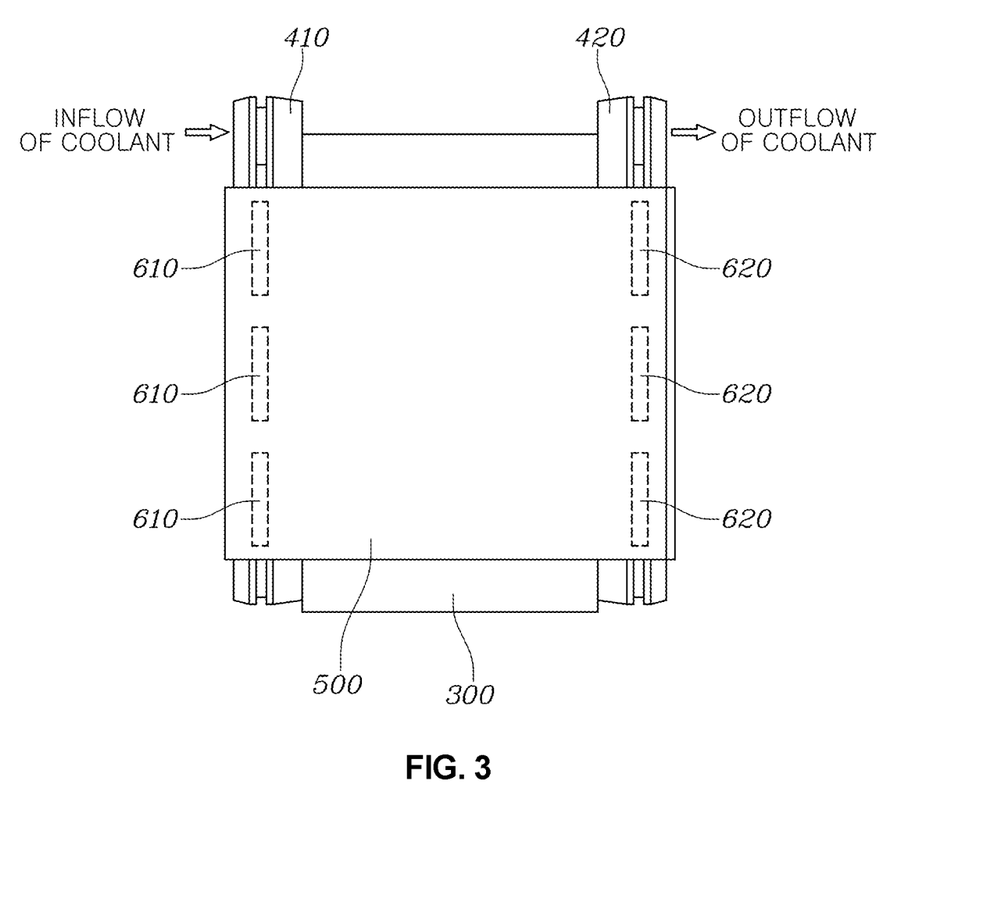
FIGS. 3 and 4 are top plan views illustrating several examples of structures in which a capacitor, cooling channels, and power modules of the motor drive device according to the embodiment of the present disclosure are disposed.

FIGS. 2 and 3 illustrate the motor drive device according to the embodiment of the present disclosure with the circuit implemented as illustrated in FIG. 1.

Figure 4:
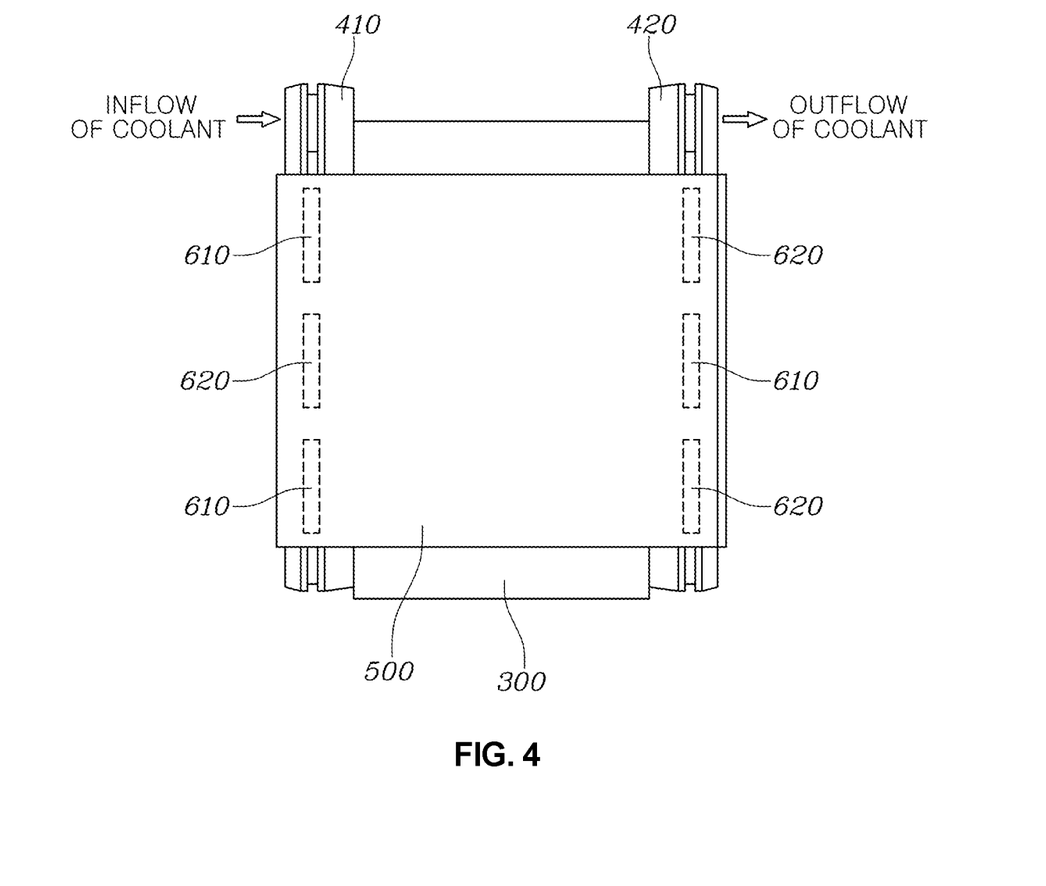

FIG. 2 is a perspective view illustrating the motor drive device according to the embodiment of the present disclosure, and FIGS. 3 and 4 are top plan views illustrating several examples of structures in which a capacitor, cooling channels, and power modules of the motor drive device according to the embodiment of the present disclosure are disposed.

Referring to FIGS. 2 to 4, the motor drive device according to the embodiment of the present disclosure may include the capacitor 300 disposed at one side of a casing 100 of the motor 40 which is close to a rotary shaft 110, first and second cooling channels 410 and 420 disposed at both sides of the capacitor 300 and each having an interior into which a coolant is supplied, a plurality of first modules 610 including some of the plurality of first switching elements S11, S12, S13, S14, S15, and S16 and some of the transfer switching elements S31, S32, and S33, and a plurality of second power modules 620 including some of the plurality of second switching elements S21, S22, S23, S24, S25, and S26. In the embodiment of the present disclosure, the plurality of first power modules 610 and the plurality of second power modules 620 are disposed to be in contact with one of the first cooling channel 410 and the second cooling channel 420, and the number of power modules being in contact with the first cooling channel 410 and the number of power modules being in contact with the second cooling channel 420 may be equal to each other.

The casing 100 of the motor 40 is a constituent element of the motor 40 that includes therein a stator including the coils C1, C2, and C3 of the motor 40, and a rotor having permanent magnets. The rotary shaft 110 of the motor 40 may protrude to be exposed to the outside of the casing 100 from one side of the casing 100. A circuit board 500 may be disposed at the other side of the casing 100, and the capacitor 300, the cooling channels 410 and 420, the power modules 610 and 620, and a drive circuit for operating the switching elements in the power modules 610 and 620, which constitute the motor drive device, are implemented on the circuit board 500.

In the embodiment of the present disclosure, the capacitor 300, the cooling channels 410 and 420, the power modules 610 and 620, and the circuit board 500, which are provided to operate the motor, are provided at the lateral side of the casing 100 of the motor, such that an upper space of the casing 100 of the motor may be utilized, and as a result, utilization of the upper space of the casing 100 of the motor may be improved when the motor and the drive device are installed in a vehicle.

The cooling channels 410 and 420 may be disposed at one side of the capacitor 300 and the other side opposite to the one side of the capacitor 300. In a coolant circulation route, the coolant may be introduced into the first cooling channel 410, and the coolant may be discharged through the second cooling channel 420. Although the connection relationship between the first cooling channel 410 and the second cooling channel 420 is not clearly illustrated in the drawings, those skilled in the art may easily implement a configuration in which a separate tube is installed to allow the cooling channels 410 and 420 to communicate with each other so that the coolant may flow from the first cooling channel 410 to the second cooling channel 420.

The coolant, which flows in the cooling channels 410 and 420, may remove heat generated by the capacitor 300 and the power modules 610 and 620 which are in contact with the cooling channels 410 and 420.

In the embodiment of the present disclosure, the power modules 610 and 620 may be manufactured in two ways.

Each of the power modules 610 and 620 includes some of the plurality of switching elements S11, S12, S13, S14, S15, S16, S21, S22, S23, S24, S25, S26, S31, S32, and S33.

The first power module 610 may include the pair of first switching elements (the pair of first switching elements S11 and S12, the pair of first switching elements S13 and S14, or the pair of first switching elements S15 and S16), which is included in one leg connected to one phase coil of the motor among the switching elements S11, S12, S13, S14, S15, and S16 in the first inverter 10, and include one transfer switching element S31, S32, or S33 connected to the corresponding phase.

The second power module 620 may include the pair of second switching elements (the pair of second switching elements S21 and S22, the pair of second switching elements S23 and S24, or the pair of second switching elements S25 and S26) which is included in one leg connected to one phase coil of the motor among the switching elements S21, S22, S23, S24, S25, and S26 in the second inverter 20.

The two inverters 10 and 20 and the transfer switching elements S31, S32, and S33 may constitute the total of six power modules 610 and 620.

In the embodiment of the present disclosure, the same number of power modules may be disposed to be in contact with the two cooling channels 410 and 420. In the illustrated example, the three power modules may be disposed to be in contact with each of the first and second cooling channels 410 and 420. In particular, in the embodiment of the present disclosure, the same number of power modules may be divided and disposed, thereby improving cooling efficiency.

In the embodiment of the present disclosure in which the open-end winding manner or the closed-end winding manner is selectively used, the first power modules 610, which include the transfer switching elements S31, S32, and S33 and the first switching elements S11, S12, S13, S14, S15, and S16 included in the first inverter 10, may be disposed to be in contact with the first cooling channel 410 into which the coolant is introduced, and the second power modules 620, which include the second switching elements S21, S22, S23, S24, S25, and S26 included in the second inverter 20, may be disposed to be in contact with the second cooling channel 420, thereby further improving cooling efficiency.

Only the first switching elements S11, S12, S13, S14, S15, and S16 are switched when the motor operates in the closed-end winding manner, and the first switching elements S11, S12, S13, S14, S15, and S16 and the second switching elements S21, S22, S23, S24, S25, and S26 are switched together when the motor operates in the open-end winding manner, such that the amount of heat generated by the first switching elements S11, S12, S13, S14, S15, and S16 may be larger. In consideration of this situation, in the embodiment of the present disclosure, the first power modules 610 may be disposed to be in contact with the first cooling channel 410 into which the coolant is introduced, and the second power modules 620 may be disposed to be in contact with the second cooling channel 420 into which the coolant is introduced via the first cooling channel 410.

As another example, the first switching elements S11, S12, S13, S14, S15, and S16 and the second switching elements S21, S22, S23, S24, S25, and S26 may be distributed to the first cooling channel 410 and the second cooling channel 420. In this case, the number of first power modules 610 disposed to be in contact with the first cooling channel 410 may be larger than the number of second switching elements, and the number of second power modules 620 disposed to be in contact with the second cooling channel 420 may be larger than the number of first power modules 610.

In this arrangement structure, the first power modules 610, which generate a large amount of heat, are disposed to be concentrated on the first cooling channel 410, thereby preventing the cooling performance implemented by the second cooling channel 420 from deteriorating due to an increase in coolant temperature.

In this arrangement structure, the second power module 620 disposed to be in contact with the first cooling channel 410 may be disposed between the first power modules 610, and the first power module 610 disposed to be in contact with the second cooling channel 420 may be disposed between the second power module 620, thereby distributing and dispersing the generated heat and thus further improving cooling performance.

The structure of the power module will be briefly described in order to facilitate understanding of the motor drive device according to the several embodiments of the present disclosure.

Figure 5:
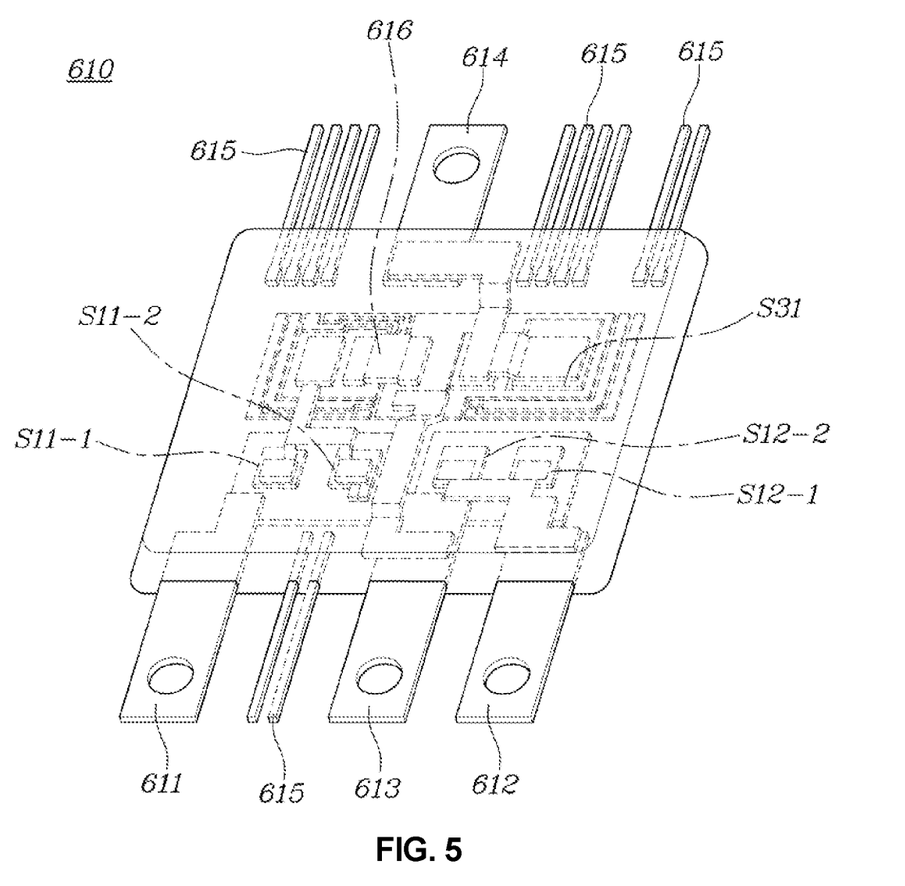
FIG. 5 is a perspective view illustrating an example of a first power module to be applied to the motor drive devices according to several embodiments of the present disclosure.
Figure 6:
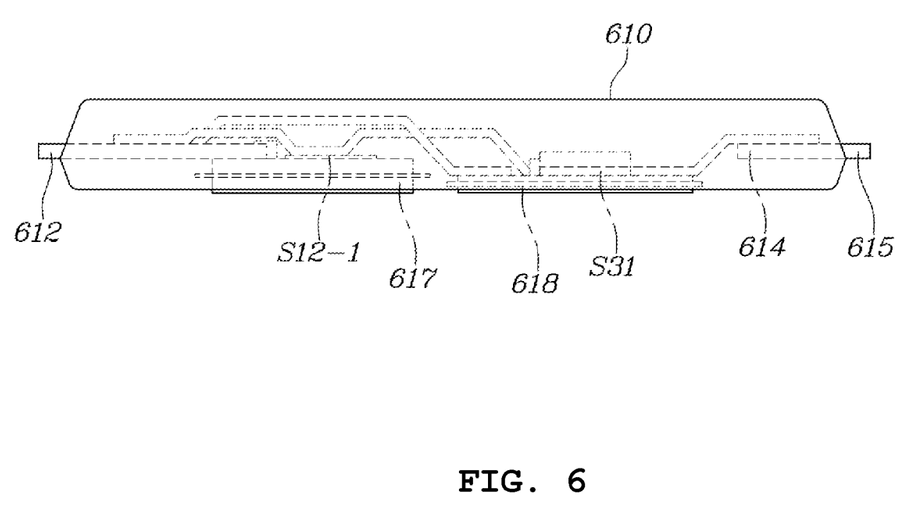
FIG. 6 is a side view illustrating the first power module illustrated in FIG. 5.

FIG. 5 is a perspective view illustrating an example of the first power module applied to the motor drive devices according to the several embodiments of the present disclosure, and FIG. 6 is a side view illustrating the first power module illustrated in FIG. 5. Reference numerals illustrated in FIGS. 5 and 6 are made on the assumption that the first power module is connected to the first phase coil C1 of the motor, and the structure of the first power module connected to another phase coil may also be easily understood from FIGS. 5 and 6. FIGS. 5 and 6 illustrate the first power module, but those skilled in the art may easily infer the structure of the second power module when the transfer switching element and a board pattern or lead connected to the transfer switching element are omitted from the first power module structure illustrated in FIGS. 5 and 6.

Referring to FIGS. 5 and 6, the first power module 610 may include boards 617 and 618, first switching elements S11-1, S11-2, S12-1, and S12-2 disposed on the boards 617 and 618, and a plurality of leads 611, 612, 613, 614, and 615 that defines connection between the transfer switching element S31 and each of the elements and defines electrical connection with an external component.

The first switching elements may include FETs S11-1 and S12-1 which are turned on/off based on external control signals, and reverse diodes S11-2 and S12-2 connected between sources and drains of the FETs.

The board 617 on which the first switching elements S11-1, S11-2, S12-1, and S12-2 are disposed may have a structure having an insulating layer and metal layers (copper layers) attached to both surfaces of the insulating layer. In this case, the metal layer may have a large thickness (e.g., 0.6 t or more) in order to easily discharge heat generated by the first switching elements S11-1, S11-2, S12-1, and S12-2.

In addition, the boards on which the two first switching elements are disposed may be individually provided to reduce board stress caused by the thick metal layer.

The elements S11-1 and S11-2, which correspond to the top phase among the first switching elements, may be electrically connected to the lead 611 connected to a high-potential terminal of the battery 200, and the elements S11-1 and S11-2, which correspond to the bottom phase among the first switching elements, may be electrically connected to the lead 612 connected to a low-potential terminal of the battery 200. The connection node between the elements S11-1 and S11-2 corresponding to the top phase and the elements S12-1 and S12-2 corresponding to the bottom phase may be electrically connected to the lead 613 connected to one end of the first coil C1 of the motor 40.

It is possible to improve assembly properties and reduce costs by applying a board having a thin metal layer to the board 618 on which the transfer switching element S31 generating a small amount of heat is disposed.

The transfer switching element S31 may be electrically connected to the lead 614 connected to the other end of the first coil C1 of the motor 40.

A shunt resistor 616, which substitutes for a current sensor, may be disposed on the board 618 on which the transfer switching element is disposed. Since the shunt resistor 616 is provided to substitute for a sensor, it is possible to improve assembly properties and reduce costs. A signal lead connected to the shunt resistor 616 is disposed adjacent to signal leads of the top phase switching elements S11-1 and S11-2, such that the signal leads may be disposed without an insulating distance therebetween, thereby reducing a size.

As described above, according to the motor drive device according to the several embodiments of the present disclosure, in order to operate the motor in two ways including the open-end winding manner and the closed-end winding manner, the first power modules, which are each manufactured as one module including the transfer switching element and the pair of switching elements corresponding to each of the phases of the motor, are applied to the first inverter, and the second power modules, which are each manufactured as one module including the pair of switching elements corresponding to each of the phases of the motor, are applied to the second inverter, such that the number of all the power modules is twice the number of phases of the motor. As a result, the power modules may be symmetrically disposed so that the same number of power modules are disposed at both sides of the capacitor, thereby improving assembly properties and efficiently configuring a cooling system.

In particular, according to the motor drive device according to the several embodiments of the present disclosure, the power modules are disposed to be in contact with the cooling channels in consideration of differences in amount of heat generated by the power modules included in the inverters when the motor operates in two ways including the open-end winding manner and the closed-end winding manner, and as a result, cooling efficiency may be further improved.

While the specific embodiments of the present disclosure have been illustrated and described, it will be obvious to those skilled in the art that the present disclosure may be variously modified and changed within the scope of the appended claims.

What is claimed is:

1. A motor drive device comprising:
a first inverter comprising a plurality of first switching elements each of which being connected to first ends of a plurality of coils corresponding to a plurality of phases in a motor;
a second inverter comprising a plurality of second switching elements each of which being connected to second ends of the plurality of coils;
a plurality of transfer switching elements connected to the second ends of the plurality of coils, the plurality of transfer switching elements configured to open or block electrical connection between the second ends;
a capacitor disposed at one side of a casing of the motor which is disposed to be adjacent a rotary shaft;
first and second cooling channels disposed at both sides of the capacitor, respectively, each of the first and second cooling channels having an interior into which a coolant is supplied;
a plurality of first power modules each comprising some of the plurality of first switching elements and some of the transfer switching elements; and
a plurality of second power modules each comprising some of the plurality of second switching elements,
wherein the plurality of first power modules and the plurality of second power modules are disposed to be in contact with the first or second cooling channel, and
wherein the number of power modules being in contact with the first cooling channel and the number of power modules being in contact with the second cooling channel are equal to each other.

2. The motor drive device of claim 1, wherein the first cooling channel and the second cooling channel communicate with each other, the coolant is introduced into the first cooling channel from outside and transmitted to the second cooling channel, and the coolant is discharged to outside from the second cooling channel.

3. The motor drive device of claim 2, wherein the plurality of first power modules are disposed to be in contact with the first cooling channel, and
wherein the plurality of second power modules are disposed to be in contact with the second cooling channel.

4. The motor drive device of claim 2, wherein the number of first power modules disposed to be in contact with the first cooling channel is larger than the number of first power modules disposed to be in contact with the second cooling channel, and
wherein the number of second power modules disposed to be in contact with the second cooling channel is larger than the number of second power modules disposed to be in contact with the first cooling channel.

5. The motor drive device of claim 1,
wherein each of the first power modules comprises:
the plurality of first switching elements connected to the first end of one of the plurality of coils; and
one of the plurality of transfer switching elements connected to the second end of the corresponding coil, and
wherein each of the second power modules comprises the plurality of second switching elements connected to the second end of one of the plurality of coils.

6. The motor drive device of claim 1, wherein a switching loss of the first switching element is smaller than a switching loss of the second switching element.

7. The motor drive device of claim 1, wherein the first switching element is a Field-Effect Transistor (FET) composed of SiC, and
the second switching element is an Insulated-Gate Bipolar Transistor (IGBT) composed of Si.

8. The motor drive device of claim 1, wherein the plurality of first power modules further include:
boards on which the plurality of first switching elements are disposed; and
a plurality of leads configured to connect the plurality of transfer switching elements and the plurality of coils.

9. The motor drive device of claim 1, wherein the rotary shaft protrudes to be exposed to outside of the casing from one side of the casing.

10. A motor drive device comprising:
a first inverter connected to first ends of three phase coils in a motor, the first inverter comprising a plurality of first switching elements;
a second inverter connected to second ends of the three phase coils, the second inverter comprising a plurality of second switching elements;
three transfer switching elements connected to the second ends of the three phase coils, the three transfer switching elements configured to open or block electrical connection between the second ends of the three phase coils;
a capacitor disposed at one side of a casing of the motor which is disposed adjacent a rotary shaft;
first and second cooling channels disposed at both sides of the capacitor, each of the first and second cooling channels having an interior into which a coolant is supplied;
three first power modules each comprising:
the plurality of first switching elements connected to the first end of one of the three phase coils; and
three second power modules each comprising the plurality of second switching elements connected to the second end of one of the three phase coils,
wherein the three first power modules and the three second power modules are disposed to be in contact with each of the first and second cooling channels.

11. The motor drive device of claim 10, wherein the first cooling channel and the second cooling channel communicate with each other, the coolant is introduced into the first cooling channel from outside and transmitted to the second cooling channel, and the coolant is discharged to outside from the second cooling channel.

12. The motor drive device of claim 11, wherein the three first power modules are disposed to be in contact with the first cooling channel, and the three second power modules are disposed to be in contact with the second cooling channel.

13. The motor drive device of claim 11, wherein the two first power modules and the one second power module are disposed to be in contact with the first cooling channel, and the two second power modules and the one first power module are disposed to be in contact with the second cooling channel.

14. The motor drive device of claim 13, wherein the one second power module is disposed between the two first power modules so as to be in contact with the first cooling channel, and the one first power module is disposed between the two second power modules so as to be in contact with the second cooling channel.

15. The motor drive device of claim 10, wherein a switching loss of the first switching element is smaller than a switching loss of the second switching element.

16. The motor drive device of claim 10, wherein the first switching element is a Field-Effect Transistor (FET) composed of SiC, and the second switching element is an Insulated-Gate Bipolar Transistor (IGBT) composed of Si.

* * * * *